United States Patent [19]

Lapeyre

[11] Patent Number: 5,245,559
[45] Date of Patent: Sep. 14, 1993

[54] PORTABLE COMPUTER WITH LARGE SCREEN DISPLAY

[75] Inventor: James M. Lapeyre, New Orleans, La.

[73] Assignee: The Laitram Corporation, New Orleans, La.

[21] Appl. No.: 879,132

[22] Filed: May 5, 1992

Related U.S. Application Data

[63] Continuation of Ser. No. 92,372, Sep. 2, 1987, abandoned, which is a continuation-in-part of Ser. No. 862,647, May 13, 1986, Pat. No. 4,891,777, which is a continuation of Ser. No. 528,975, Sept. 2, 1983, abandoned, which is a continuation-in-part of Ser. No. 493,613, May 11, 1983, abandoned, which is a continuation of Ser. No. 092,372, Sept. 2, 1987, which is a continuation-in-part of Ser. No. 787,633, Oct. 15, 1985, abandoned, which is a continuation-in-part of Ser. No. 459,998, Jan. 21, 1983, Pat. No. 4,547,860.

[51] Int. Cl.$^5$ ............................................. G06F 3/023
[52] U.S. Cl. .......................... 364/710.14; 364/709.15; 364/709.16
[58] Field of Search ............ 364/710.14, 705.04, 364/709.15, 709.16

[56] References Cited

U.S. PATENT DOCUMENTS

| | | | |
|---|---|---|---|
| 3,967,273 | 6/1976 | Knowlton | 364/709 |
| 3,995,123 | 11/1976 | Wilson | 364/705.05 |
| 4,070,649 | 1/1978 | Wright, Jr. et al. | 364/705 |
| 4,120,037 | 10/1978 | Sato | 364/705 |
| 4,150,435 | 4/1979 | Satoh | 364/705 |
| 4,184,202 | 1/1980 | McCrae | 364/710 |
| 4,203,152 | 5/1980 | Watson et al. | 364/710 |
| 4,237,540 | 12/1980 | Sato | 364/705 |
| 4,247,902 | 1/1981 | Sado | 364/710 |
| 4,300,204 | 11/1981 | Maeda et al. | 364/705.07 |
| 4,396,941 | 8/1983 | Nishimura et al. | 364/705 |
| 4,489,429 | 12/1984 | Hashimoto | 364/710 |
| 4,531,194 | 7/1985 | Morino et al. | 364/705 |
| 4,535,416 | 8/1985 | Kano et al. | 364/710 |
| 4,695,976 | 9/1987 | Nakanishi et al. | 364/709 |
| 4,751,668 | 6/1988 | Aihara | 364/710 |
| 4,852,057 | 7/1989 | Patton | 364/709.06 |

FOREIGN PATENT DOCUMENTS 0122459  6/1985  Japan ................. 364/706

OTHER PUBLICATIONS

Claver, et al, "Computer-Assisted Word Entry Process" *IBM Tech. Disclosure Bulletin* vol. 21, No. 10 Mar. 1979 p. 4184.

*Primary Examiner*—David H. Malzahn
*Attorney, Agent, or Firm*—Laurence R. Brown; James T. Cronvich

[57] ABSTRACT

A programmable portable electronic computer by means of a twelve key keyboard array capable of entering a full range of alphameric characters and computer commands has room for a large area electronic display screen. This affords room for graphical presentations with alphanumeric notation, and enough rows of printed text to afford word processing capabilities. Thus, a tape recorder within the housing may include software and is coupled for use in dictating, storage, word processing and computer interfacing use, all under control of the keyboard keys.

2 Claims, 6 Drawing Sheets

FIG. 3.

PORTABLE COMPUTER WITH LARGE SCREEN DISPLAY

This application is a continuation of Ser. No. 07/092,372, filed Sep. 2, 1987, now abandoned, which was a continuation-in-part of Ser. No. 06/862,647, filed May 13, 1986, now U.S. Pat. No. 4,891,777, granted Jan. 2, 1990, which was a continuation of Ser. No. 06/528,975 filed Sep. 2, 1983, now abandoned, which was a continuation-in-part of Ser. No. 06/493,613, filed May 11, 1983, now abandoned. Also this application is a continuation of Ser. No. 07/092,372, filed Sep. 2, 1987, in turn a continuation-in-part of Ser. No. 06/787,633, filed Oct. 15, 1985, now abandoned, which was a continuation-in-part of Ser. No. 06/459,998 filed Jan. 21, 1983, now U.S. Pat. No. 4,547,860, granted Oct. 15, 1985.

TECHNICAL FIELD

This invention relates to programmable portable electronic computers, and more particularly it relates to portable computers with large screen displays capable of graphical presentations and useful in the word processing mode of computer operation.

BACKGROUND ART

A computer system is disclosed in these parent applications which can process alphanumeric information as well as many different computer commands from a keyboard having only twelve to sixteen keys. That is achieved by providing several modes of operation of the keys in the keyboard, typically a single stroke per entry decimal calculating mode and a two key stroke entry alphanumeric data processing mode which incorporates a significant number of computer commands.

In the portable electronic computer art, generally providing pocket sized general purpose computing capabilities with programmable computer systems, the art has developed in a manner requiring a large number of keyboard keys. Particularly where alphanumeric capabilities are required for data processing purposes, typewriter style keyboards are the most common. Thus, the number of keys often exceed forty. Even for arithmetic calculators as many as forty-five keys are provided to cover some of the many command functions available with modern computer chips in pocket sized calculators. The above parent applications have taken a direction contrary to the rest of the art in reducing the number of keys on a computer keyboard without sacrifice of the wide range of operations that the computer can perform.

A typical prior art example is the Casio fx-7000G programmable scientific calculator having a keyboard array of forty-five keys and boasting a large display screen. In fact this display screen occupies less than one-third of the front panel surface area since it must share space with the many keyed keyboard. Thus display space is so limited by keyswitch space that there is limited room for graphical displays and thus either graph detail or size is limited.

There is no known portable pocket sized programmable computer having word processing capability, primarily because there has not been enough display room available on the front panel because of the need for a large number of keyboard keys to process alphanumeric data as well as the various computer command functions necessary to operate a word processing operation.

Accordingly it is an objective of this invention to provide programmable portable electronic computers with enlarged electronic display panels affording with associated computer capabilities the capacity to display graphical information and alphanumeric data for word processing.

BRIEF DESCRIPTION OF THE INVENTION

A programmable portable electronic computer housing has a front panel sharing a keyboard and display panel with the keyboard section taking up no more than half the area of the front panel, thereby providing a large screen display for graphical configuration and multiple line alphanumeric display for purposes such as word processing. In order to provide a larger screen area in a pocket sized portable computer, the keyboard is limited to twelve or sixteen keys. These keys provide for entry of both arithmetic and alpha data as well as a large inventory of computer commands.

The decreased number of keys permitting manual entry without crowding the finger space available is achieved by the data entry configurations of the parent applications hereto, namely the entry of alpha data and computer commands by the use of more than one key being stroked. These applications are incorporated by reference in their entireties hereinto. Similarly the feature of identifying on the keyboard keys charted information showing the two keys to be chosen for entry of the alpha data and computer commands is incorporated so that the computer may contain self sufficient instructions without needing to address a manual or log external to the computer. The back panel may be used for further instructions provided to set up less frequently encountered commands and operation modes.

The computer includes a movable tape recorder for use in word processing to store digital data. It can also store programs or data removed from the computer memory. Furthermore the tape recorder may be used for dictation of oral data in a dictation mode.

One feature of the invention is to use the keyboard keys for a variety of different modes, such as a dictation mode, a word processing mode, a numeric mode with decimal digits entered by a single keystroke, and an alpha mode with alphabetic characters entered by two successive mutually exclusive keystrokes.

BRIEF DESCRIPTION OF THE DRAWINGS

Throughout the various views of the accompanying drawing similar reference characters identify similar features for ready comparison. The invention is set out in its preferred embodiment form, as follows:

FIG. 3 is a sixteen key version of the computer shown with alphanumeric word processing data on the oversized display screen.

THE PREFERRED EMBODIMENTS

Figure 1:
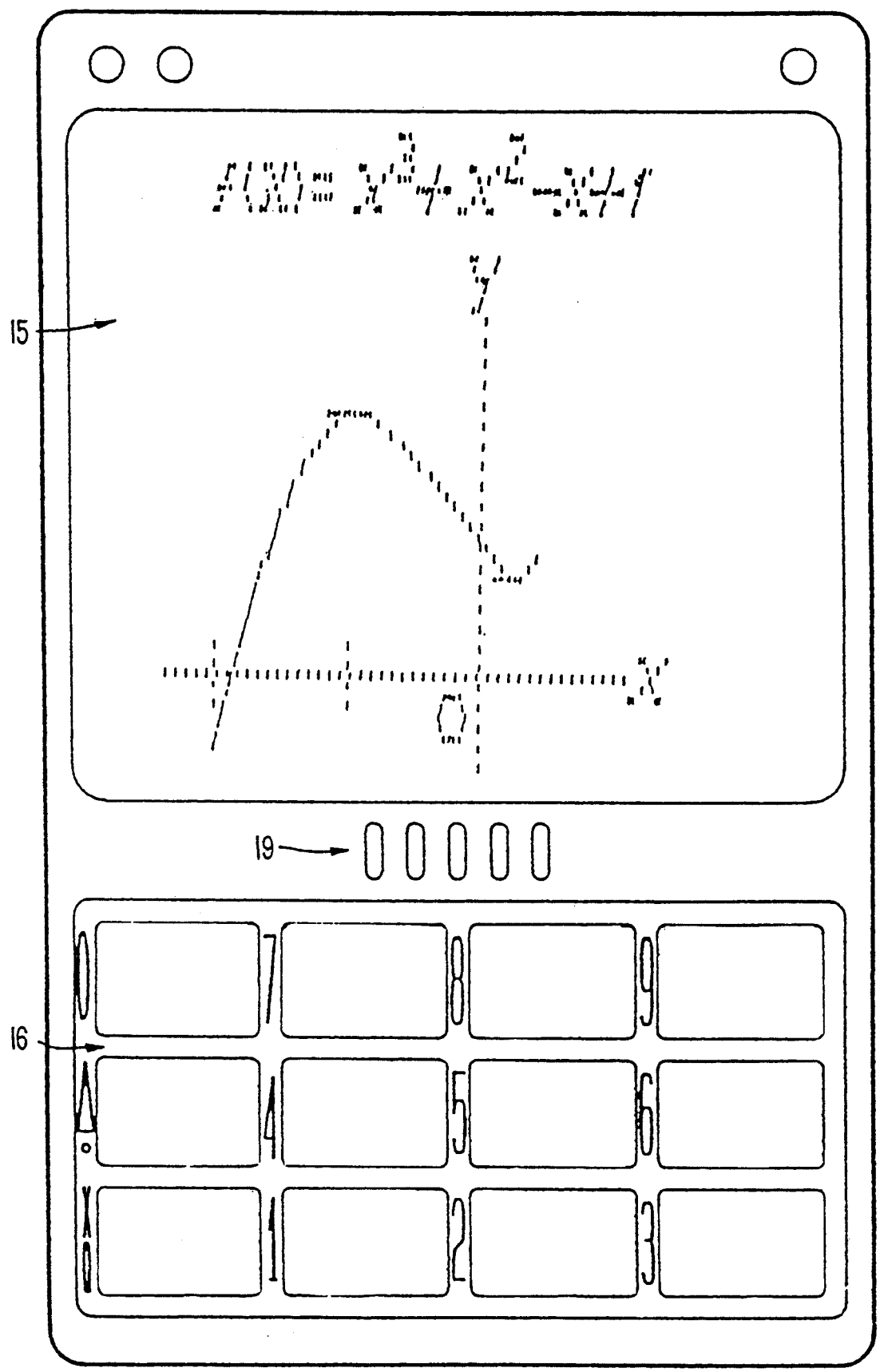
FIGS. 1 and 2 show respectively in front and side panel view a pocket sized computer embodiment having twelve keys and an oversized display area capable of graphic illustration.
Figure 2:
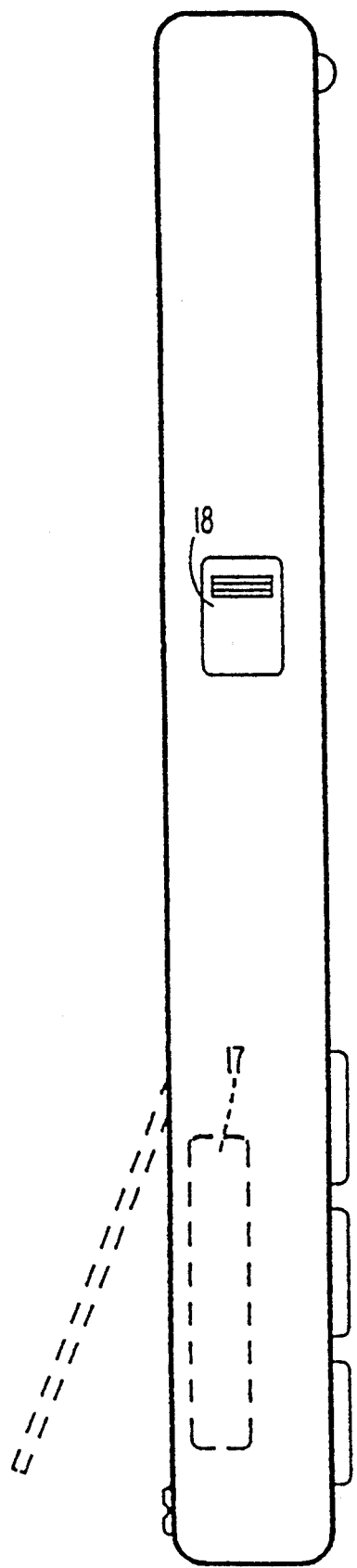

As may be seen by reference to FIGS. 1 and 2, a pocket sized computer is afforded by this invention wherein the display area space 15 is not limited significantly by an excessive number of manually operable keys, and thus constitutes more than half the shared front panel space partly taken up by the twelve key keyboard section 16.

The graphic display on the screen 15 includes not only space for an enlarged graph in great detail, but also has the corresponding alphanumeric notation therealongside. This panel space could not have been available on a pocket sized portable computer from a keyboard of the typewriter character, which would take up much more room than the twelve keys provided. Also these keys are large enough for comfortable and accurate manual entry to be manipulated by an operator's fingers in a touch type mode if desired.

It has been possible therefore to reduce keyboard panel space and enlarge display panel space by use of a twelve key keyboard having alpha capabilities. This is achieved by entering the alphabet characters, for example, by means of two keystrokes per character. As indicated in the parent cases, this technique will provide for 144 choices from twelve keys so that there will be room for up to about one hundred computer commands to be selected from the set of twelve keys. Thus the reduction of numbers of keys in no way limits the capabilities of the keyboard to operate the computer fully.

It may be seen from the keyboard that the twelve keys are designated by notation to the left of the key indicating the ten numeric digits (0 to 9), an execute key (XQ) and a decimal point key. The latter key serves a dual function as an "enter" key signified by the arrow so that when the second decimal point occurs in any entry, such as a multidigit decimal word, or such as in two successive decimal point strokes, an entry of the preceding information occurs. See my U.S. Pat. No. 4,567,567 Jan. 28, 1986 in this respect. The computer operates in the conventional manner of serially entering digits or characters until an enter command occurs.

Figure 4:
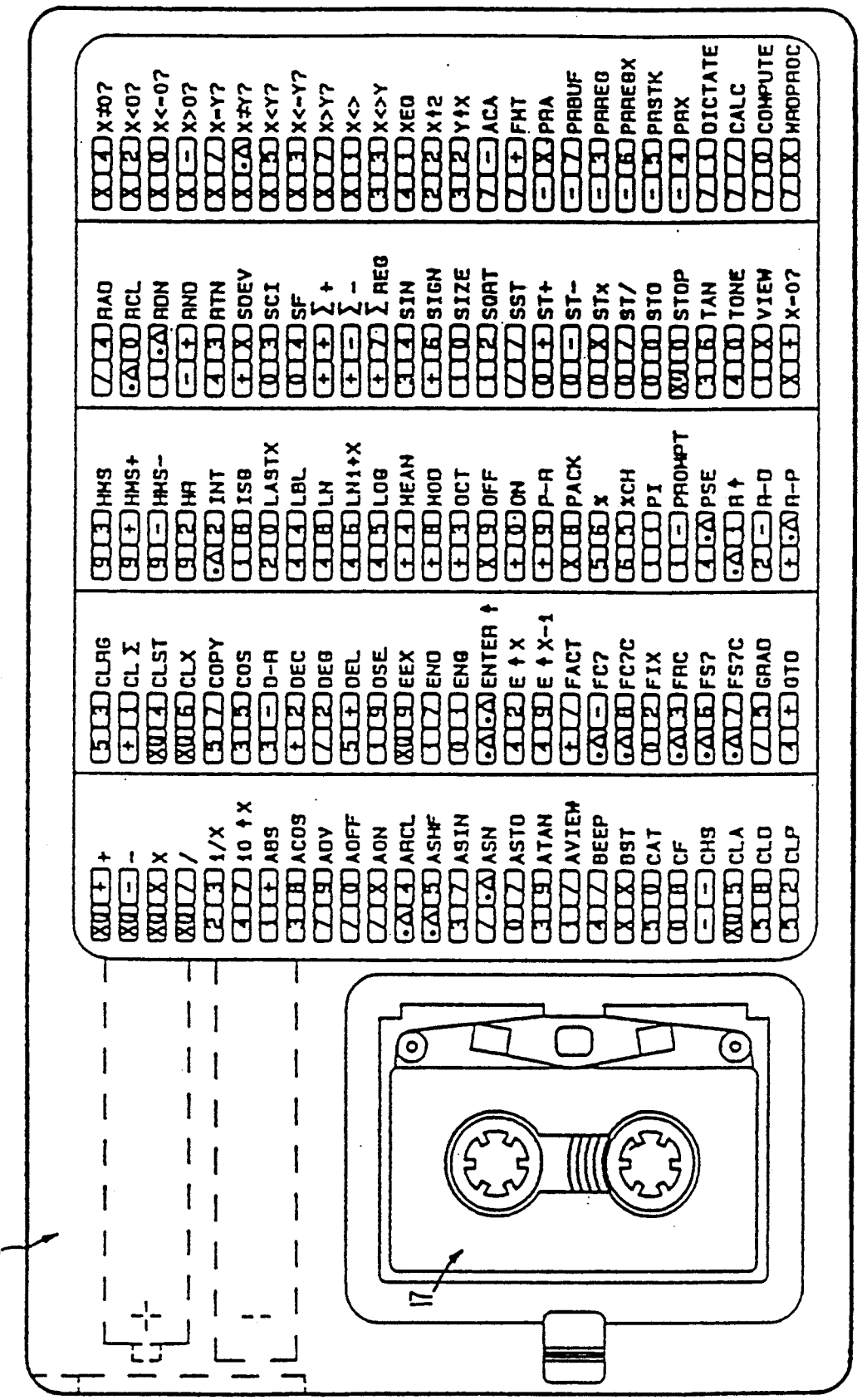
FIG. 4 is a back panel view showing additional keystroke instructions for functions not identified on the keys of the front panel, and an incorporated tape cassette used for digital communications with the computer and for oral dictation purposes.

Also it may be observed that on each key is a chart listing a set of twelve functions initiated by that key and identifying the second keystroke in the sequence to complete the designated entry. Thus to enter A for example keys 4-5 are stroked in sequence as indicated in the upper left hand corner of the "4" key. Similarly the decimal digit "1" is entered by the two stroke sequence of the decimal point key and the "1" key. It is also possible to program the keys for other functions than displayed. For example if only numeric calculations are desired, then a "decimal" mode could be chosen wherein the twelve keys can be made "live" for single stroke entry of the decimal digits to save key entry time. Other such modes may be chosen such as a "dictate" mode to be discussed hereinafter wherein the keyboard keys are adapted to the control and use of the internal movable tape cassette 17, thumb switch 18 microphone and replay speaker 19 for the functions normally expected for dictating purposes by means of key stroke control entries. These entries may of course be a portion of the 144 available functions if they are not allocated for other purposes. The functions available are shown in abbreviated format such as "word proc" for the word processing mode obtained from the XQ-1 keystroke sequence. Other functions or selections or modes may be shown in the additional chart area on the back panel as shown in FIG. 4 wherein the two keystrokes and command, mode selection, character or other computer function are identified.

Figure 3:
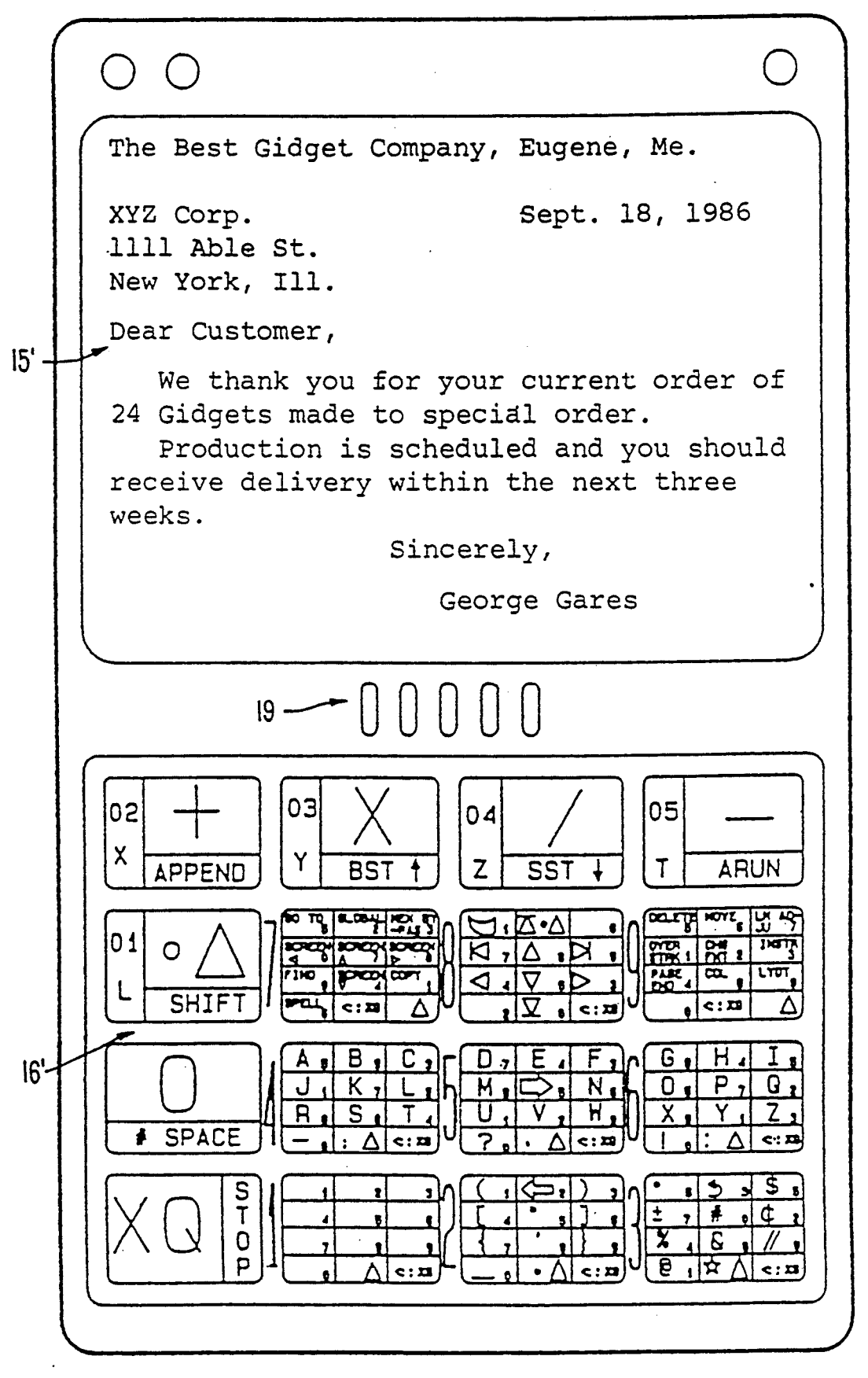

As may be seen from FIG. 3, the enlarged screen area of display section 15' is sufficient to provide for multiple line alphanumeric displays. This is particularly useful for word processing and makes it feasible to incorporate work processing into a pocket sized programmable electronic computer. Such documents as displayed upon the screen 15' are created by the computer in response to manual information entered into the computer from the keyboard 16'.

The keyboard keys control the various functions related to word processing from stored program materials in the computer in the manner described in the parent cases using the keyboard keys for the various controls as well as for data input. The movable tape recording means is also controlled by the computer and the keys to store the documents in digital form. Thus the tape recorder is used in different modes such as "dictation" and "word processing" to produce a versatile capability in a pocket sized portable computer comparable to that attainable in personal computers, and can additionally serve as an oral communication medium for dictation and the like, where essentially the tape recorder is controlled by the keyboard rather than the computer.

Figure 5:
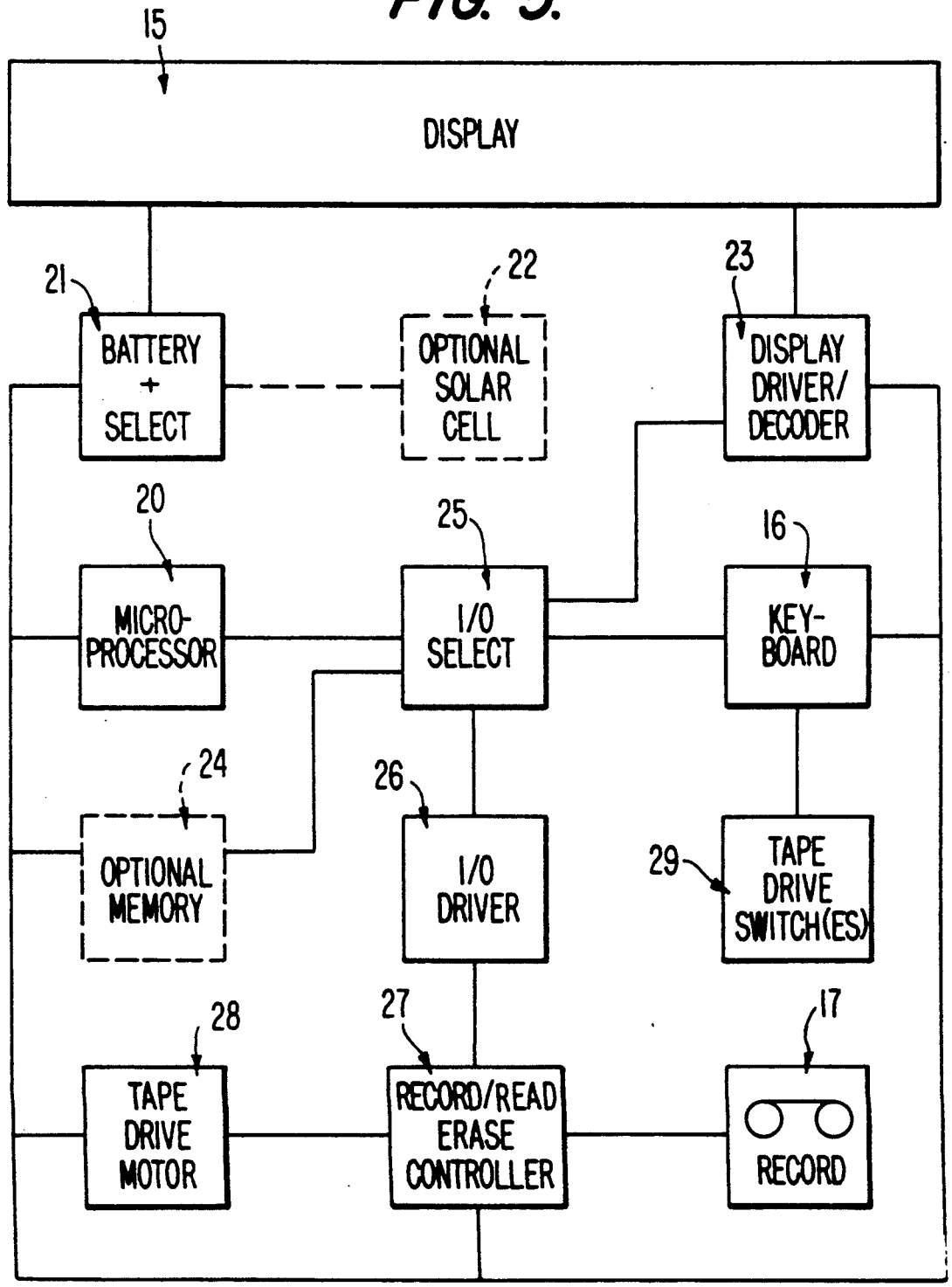
FIG. 5 is a block diagram sketch of the overall computer data flow through the usual computer sub-system portions.

The operating system is shown in block diagram form in FIG. 5 relating the keyboard 16, display screen 15 and movable tape recorder 17 to the computer microprocessor 20. This portable pocket sized system is powered by batteries 21 and/or the equivalent solar cells 22. The screen graphical or alphanumeric message is supplied by means of the driver-decoder 23, which works in conjunction with the computer 20 to organize and display information using whatever memory facilities are available and required in the computer 20 and the driver-decoder section 23. Optional further memory 24 may be incorporated, for example to receive and store information from the tape recorder 17 for word processing and/or display on the screen 15.

The input/output control section 25 coordinates the various sources and depositories of information and control commands whether they come from the keyboard 16 or computer 20. The interfacing driver 26 to the movable tape unit 17 permits the tape control section 27 to operate the tape drive motor 28 and the recording or reading functions of the tape recorder 17, such as interconnection of microphone, speaker and connections to memory or computer. Control of the tape through section 29 is coordinated with the keyboard 16, which also controls the associated word processing and computer command functions, so that in the "word processing" mode the system functions in a corresponding manner to state of the art word processors in personal computer sized console systems, for example.

Figure 6:
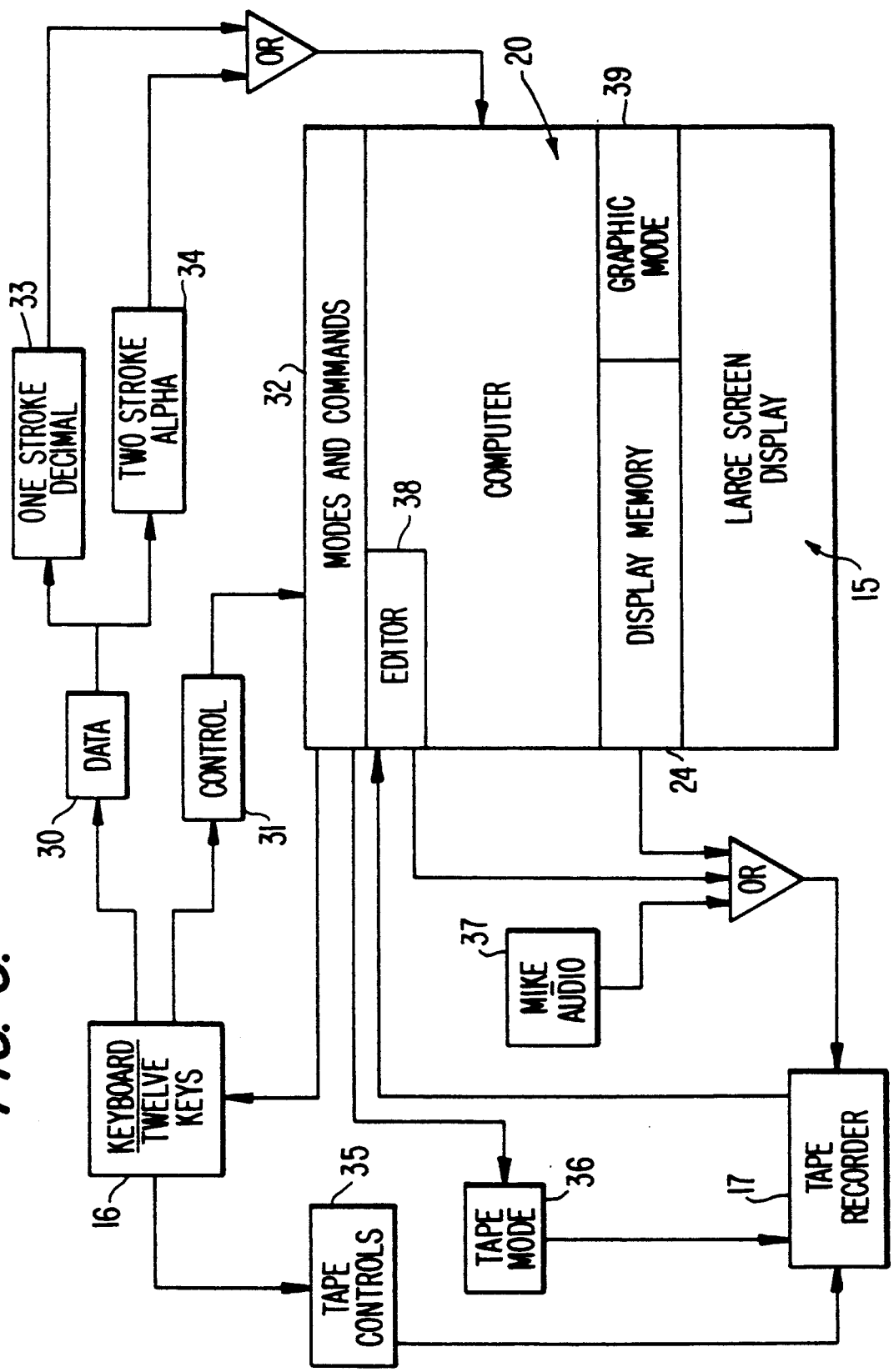
FIG. 6 is a block functional control diagram of a computer constructed in accordance with this invention.

FIG. 6 supplements the control functions just described with its data flow block diagram system relating to the keyboard 16, tape recorder 17 and computer 20. Data 30 and control commands 31 are both derived from the keyboard to supplement whatever data and commands are contained in the computer software, storage and command processing structure. Thus the keyboard entries may through the computer system modes and commands processing section 32 control the function of the keyboard 16 itself to reorient the keys for different modes of operation.

As aforesaid, two different modes might be a one stroke per entry decimal mode of operation (33), which initiates the entry and flow of data, and a two stroke per entry alpha and computer command mode (34) which initiates both the entry and flow of data and the flow of command signals to the computer system. A third mode as previously discussed might be the word processing or tape modes (36) wherein the keyboard controls all the normal functions of word processing including the tape drive control functions (35) hereinbefore described, either directly through the keyboard or as programmed by suitable computer software. In this respect the tape recorder 17 is operable either from a microphone or other audio source (37), the computer editor section (38) or from computer storage such as for retaining word processing information available on the display screen 15 as may be contained explicity in a display memory section 24, which may include graphs formulated in the graphic mode of computer operation (39).

It is seen therefore that this invention provides a portable computer with a large screen capability which is made possible by interaction of various system features. In this interaction the ability to provide comprehensive control of alphanumeric information and a large number of computer commands from very few keyboard keys, such as twelve or sixteen, is critical to the provision of a large enough display screen on a pocket sized programmable computer to process graphical displays and enough text presentation to make feasible word processing and other data handling features not heretofore feasible on such computers, such as dictation and storage of considerable quantities of both digital and oral data that is processed.

Other features are made possible by this invention such as the storage of computer software programming in the movable tape storage medium for such purposes as word processing and special programs that are of interest to the user. The use of the computer in either an oral dictating mode or a word processing digital mode provides a system capability not heretofore available in portable pocket sized computer systems. Portable pocket sized computers heretofore have required too many keys to provide for alphanumeric operation and a full range of computer capabilities to be able either to afford large display screen areas or the comprehensive range of computer capabilities made available by this invention.

I claim:

1. A programmable portable hand held electronic alphanumeric data processing computer with an electronic display panel having a predetermined surface area, comprising in combination,
    a housing containing said electronic computer having an operator access panel of predetermined surface area with a keyboard and said electronic display panel sharing said surface area,
    said keyboard having a plurality of no more than sixteen manually operable keys spaced in a compact side-by-side key array thereby comprising less than half the area of the operator access panel surface area for manual operation of said keys for entering both alphanumeric data and instructions into the computer,
    a computer control system in said housing having said no more than sixteen keys connected thereinto for programming and controlling the operation of said electronic computer including the input and processing of said alphanumeric data and the formulation and displaying of graphs, said electronic display panel occupying more than half of said operator access panel surface area to provide room for display of graphs and accompanying alphanumeric data,
    graphics processing means coupled into the computer control system for operation in a graphics display mode of operation to organize data processed by the computer system in a format for visual observation in graphic format on the electronic display panel, and
    alphanumeric graph annotation means operable by the computer control system for instituting in said graphic display mode graphical representations of data processed by the computer together with related alphanumeric notations.

2. A programmable hand held portable alphanumeric electronic data processing computer with an electronic display panel, comprising in combination,
    a rectangular housing containing said computer of a size to be carried in the hand having a keyboard and a rectangular said display panel with a major vertical dimension sharing a common surface panel of the housing, said keyboard having a set of no more than sixteen keys spaced in an array of side-by-side keys easily reached for individual operation of the keys by the fingers of one hand,
    a computer control system in said housing having said keys functionally connected therewith for programming and controlling the operation of the computer including the input of alphanumeric data characters from the keys and the manner of processing data,
    means for coupling said electronic display panel into said computer control system to display a multiplicity of lines of alphanumeric data processed by the computer and to generate graphical displays with related alphanumeric notations for display on said electronic display panel of graphs indicative of data processing and numerical calculations performed by the computer,
    said common surface panel having a display screen dimension occupying a major portion of the common surface panel with said major vertical dimension for visually reproducing from internal computer data said multiplicity of lines of alphanumeric data and said graphical displays with related alphanumeric notations, and
    computer operating means coupling said set of keys for presenting a comprehensive set of alphanumeric data characters and a significant range of computer instructions, whereby said array of keys occupies such little space on said common surface panel that said display panel accompanying said major portion of the common surface panel has room to display enlarged graphs and related annotations.

* * * * *